US011155932B2

United States Patent
Nakamura et al.

(10) Patent No.: US 11,155,932 B2
(45) Date of Patent: Oct. 26, 2021

(54) METHOD FOR PRODUCING PIEZOELECTRIC SINGLE CRYSTAL INGOT AND PIEZOELECTRIC SINGLE CRYSTAL INGOT

(71) Applicant: JFE MINERAL COMPANY, LTD., Tokyo (JP)

(72) Inventors: Keiichiro Nakamura, Tokyo (JP); Kazuhiko Echizenya, Tokyo (JP)

(73) Assignee: JFE MINERAL COMPANY, LTD., Tokyo (JP)

(*) Notice: Subject to any disclaimer, the term of this patent is extended or adjusted under 35 U.S.C. 154(b) by 87 days.

(21) Appl. No.: 16/621,993

(22) PCT Filed: Jul. 6, 2018

(86) PCT No.: PCT/JP2018/025627
§ 371 (c)(1),
(2) Date: Dec. 12, 2019

(87) PCT Pub. No.: WO2019/031126
PCT Pub. Date: Feb. 14, 2019

(65) Prior Publication Data
US 2020/0131667 A1    Apr. 30, 2020

(30) Foreign Application Priority Data
Aug. 9, 2017  (JP) .............................. JP2017-153878

(51) Int. Cl.
*C30B 29/32*    (2006.01)
*C04B 35/499*    (2006.01)
(Continued)

(52) U.S. Cl.
CPC ............ *C30B 29/32* (2013.01); *C04B 35/499* (2013.01); *C30B 11/00* (2013.01); *C30B 29/30* (2013.01);
(Continued)

(58) Field of Classification Search
CPC ..... H01L 41/1875; C30B 29/32; C30B 29/30; C30B 11/00; C30B 11/001; C30B 11/006; C30B 11/08
See application file for complete search history.

(56) References Cited

U.S. PATENT DOCUMENTS 6,020,675 A    2/2000  Yamashita et al.
6,620,752 B2*  9/2003  Messing .............. C04B 35/634
                                              501/136
(Continued)

FOREIGN PATENT DOCUMENTS

CN    1563513 A    1/2005
CN    105390607 A    3/2016
(Continued)

OTHER PUBLICATIONS

International Search Report, dated Aug. 7, 2018, from corresponding PCT application No. PCT/JP2018/025627.
(Continued)

*Primary Examiner* — C Melissa Koslow
(74) *Attorney, Agent, or Firm* — Nixon & Vanderhye (57) ABSTRACT

A method for producing a piezoelectric single crystal ingot shows small variation in the concentration of $PbTiO_3$ in the growth direction of single crystal. A complete solid solution-type piezoelectric single crystal ingot is produced by using the Bridgman method, including: filling a starting material, wherein a relaxor having a compositional formula $Pb(B_1, B_2)O_3$ is blended with lead titanate having a composition $PbTiO_3$ to give a preset composition, into a crucible for growth; heating to the melting temperature to give a melted liquid layer; then moving the crucible for growth toward the low temperature side; and thus starting one-direction solidification from the lower part of the crucible to thereby produce a single crystal. During solidification, the feedstock
(Continued)

containing the relaxor and lead titanate having a maximum grain size ≤3 mm is continuously supplied into the crucible.

5 Claims, 4 Drawing Sheets

(51) Int. Cl.
 *C30B 11/00* (2006.01)
 *C30B 29/30* (2006.01)
 *H01L 41/187* (2006.01)

(52) U.S. Cl.
 CPC .. *H01L 41/1875* (2013.01); *C04B 2235/3234* (2013.01); *C04B 2235/3255* (2013.01); *C04B 2235/3296* (2013.01); *C04B 2235/5427* (2013.01)

(56) References Cited

U.S. PATENT DOCUMENTS

| | | | |
|---|---|---|---|
| 7,572,224 B2 | 8/2009 | Hosono et al. | |
| 8,119,024 B1* | 2/2012 | Matsushita | C30B 29/30 |
| | | | 252/62.9 PZ |
| 8,326,388 B2 | 12/2012 | Kanayama et al. | |

FOREIGN PATENT DOCUMENTS

| | | |
|---|---|---|
| JP | 3420866 B2 | 6/2003 |
| JP | 2004-147940 A | 5/2004 |
| JP | 2006-095167 A | 4/2006 |
| JP | 2009-280413 A | 12/2009 |
| JP | 2010-143782 A | 7/2010 |

OTHER PUBLICATIONS

Office Action issued in Chinese Patent Application No. 201880051493.8 dated Mar. 4, 2021 with English translation provided.
Search Report issued in Chinese Patent Application No. 201880051493.8 dated Feb. 24, 2021 with English translation provided.
Luo et al., "The Growth, Properties and Applications of PMNT, a New Piezocrystal", Journal of Harbin University of Technology, vol. 31, No. 3, pp. 155-158, Publication No. 20021231, English abstract provided.
Yan et al., "Bridgmam Growth of Single Crystal with Continuous Feeding", Journal of Synthetic Crystals, vol. 23, No. 3-4, p. 280, English translation provided.
Matsushima et al., "Development of Large Diameter Piezo-Single Crystal PMN-PT with High Energy Conversion Efficiency," JFE Technical Report, No. 6, Oct. 2005, pp. 46-53.
Luo et al.,"The Progress Update of Relaxor Piezoelectric Single Crystals," IEEE International Ultrasonics Symposium Proceedings, 2009, pp. 968-971.

* cited by examiner

METHOD FOR PRODUCING PIEZOELECTRIC SINGLE CRYSTAL INGOT AND PIEZOELECTRIC SINGLE CRYSTAL INGOT

TECHNICAL FIELD

The present invention relates to a piezoelectric single crystal ingot containing $PbTiO_3$ and, more particularly, to a method for producing a piezoelectric single crystal ingot in which $PbTiO_3$ compositional variation in a growth direction of single crystal is suppressed.

BACKGROUND ART

A known example of a practical piezoelectric material is lead zirconate titanate ($PbZr_xTi_{(1-x)}O_3$, (where $x \approx 0.5$)), which is a solid solution of lead zirconate ($PbZrO_3$) and lead titanate ($PbTiO_3$). However, the lead zirconate titanate cannot be obtained in the form of a single crystal having a size, for example, a cross-sectional area of 1 cm², suitable for practical use and therefore there is a problem in that a crystal orientation exhibiting excellent piezoelectric properties inherent in lead zirconate titanate cannot be selectively used.

On the other hand, a solid solution piezoelectric single crystal (relaxor-lead titanate solid solution single crystal) containing a lead-based compound (Pb ($B_1$, $B_2$)$O_3$) called a relaxor and lead titanate ($PbTiO_3$) and having a perovskite structure has attracted attention. In the lead-based compound, $B_1$ is at least one element selected from the group consisting of Zn, Mg, Ni, Sc, In and Yb, and $B_2$ is at least one element selected from the group consisting of Nb and Ta. The relaxor-lead titanate solid solution single crystal makes it possible to grow a single crystal having a size suitable for practical use, and to produce a piezoelectric device having a practical size whose crystal orientation exhibiting excellent inherent piezoelectric characteristics depending on the application is selected. Examples of the solid solution single crystal include a solid solution (Pb$(Mg_{1/3}Nb_{2/3})_{(1-x)}Ti_xO_3$) (hereinafter also referred to as PMN-PT) of lead magnesium niobate ($Pb(Mg_{1/3}Nb_{2/3})O_3$) and lead titanate ($PbTiO_3$) and a solid solution ($Pb(In_{1/2}Nb_{1/2})_{(1-x-y)}(Mg_{1/3}Nb_{2/3})_yTi_xO_3$) (hereinafter also referred to as PIN-PMN-PT) of indium niobate ($Pb(In_{1/2}Nb_{1/2})O_3$), lead magnesium niobate ($Pb(Mg_{1/3}Nb_{2/3})O_3$), and lead titanate ($PbTiO_3$).

However, when these single crystals PMN-PT and PIN-PMN-PT are produced using a vertical Bridgman method widely used as a method for obtaining industrially useful single crystals, there is a problem in that a single crystal composition is likely to vary due to the segregation phenomenon of $PbTiO_3$ and it is difficult to produce a single crystal having a uniform composition.

For such a problem, for example, Patent Literature 1 discloses a method for producing a solid solution piezoelectric single crystal ingot containing a relaxor having a composition formula of Pb(Mg, Nb)$O_3$ and lead titanate having a composition of $PbTiO_3$, using a Bridgman method. In the technique described in Patent Literature 1, a raw material is continuously fed to the crucible for growth so that the variation of the compositional fraction of lead titanate is within the range of ±2.0 mol % or less over a length of 30 mm or more. This makes it possible to obtain a piezoelectric single crystal ingot having a uniform composition where $PbTiO_3$ compositional variation is ±2.0 mol % or less in the range of 30 mm or more in the growth direction of single crystal.

CITATION LIST

Patent Literature

Patent Literature 1: JP 2009-280413 A

SUMMARY OF INVENTION

Technical Problem

However, even if a piezoelectric single crystal device is produced using a piezoelectric single crystal ingot that is said to have a uniform composition as described above, the piezoelectric properties of the piezoelectric single crystal device produced from a part of a region of the piezoelectric single crystal ingot may be out of the practical range. As a result, there is a problem in that the product yield is reduced. This is presumably because the piezoelectric properties of the produced piezoelectric single crystal device vary greatly depending on the $PbTiO_3$ concentration in the piezoelectric single crystal device. That is, even in a piezoelectric single crystal ingot having a composition where a $PbTiO_3$ compositional variation range is ±2.0 mol % or less in the range of 30 mm or more in the growth direction of single crystal, from the viewpoint of producing single crystal piezoelectric devices of various sizes, the $PbTiO_3$ compositional variation range is too large. Thus, there is a problem in that the concentration range of $PbTiO_3$ may be out of the range exhibiting practically effective piezoelectric properties.

Therefore, an object of the present invention is to provide a method for producing a piezoelectric single crystal ingot, in which a compositional variation range of lead titanate $PbTiO_3$ is narrow in a growth direction of single crystal. Specifically, the production method is a method for producing a piezoelectric single crystal ingot in which the concentration of lead titanate $PbTiO_3$ is substantially constant, and the variation range of the concentration is ±0.5 mol % or less over a length of 100 mm or more in the growth direction of single crystal.

The piezoelectric single crystal ingot targeted by the present invention is a solid solution piezoelectric single crystal ingot containing a relaxor having a composition formula of Pb($B_1$, $B_2$)$O_3$ and lead titanate having a composition of $PbTiO_3$.

Solution to Problem

In order to achieve the above-mentioned object, the present inventors have diligently studied factors affecting compositional variation of a piezoelectric single crystal in the production of the piezoelectric single crystal using the Bridgman method of continuously feeding a raw material. As a result, it has been conceived that the compositional variation of the piezoelectric single crystal is greatly influenced by the size of the continuously fed raw material.

In the production of the piezoelectric single crystal using the Bridgman method of continuously feeding a raw material, additional raw materials are fed to a sub-crucible at a constant feed rate. However, it has been found that the time required for melting varies depending on the size of the fed raw materials. For this reason, it has been found that the amount of a raw material (melted feedstock) added dropwise to a melt layer varies, and the composition of the growing single crystal varies. That is, it has been found that when the size of the fed raw material is large, even if the raw material is dropped into the sub-crucible at a constant feed rate, the time required for melting varies, thus the amount of the raw material (melted feedstock) dropped into the melt layer varies, and the variation range of the composition of the growing single crystal increases.

Thus, the present inventors have further studied and found that if the size of the fed raw material is 3 mm or less in terms of maximum particle size, the variation in the time required for melting is reduced. It has been found that when the size of the fed raw material is 3 mm or less in terms of maximum particle size, variation in the amount of the raw material (melted feedstock) dropped into the melt layer is suppressed, the feed rate of the continuously fed raw material is constant, and a piezoelectric single crystal ingot which has a uniform composition and in which a compositional variation range of lead titanate $PbTiO_3$ is small in the growth direction of single crystal can be produced.

The present invention has been made on the basis of the above-described findings and further investigations.

Embodiments of the present invention can be summarized as follows:

(1) A method for producing a solid solution piezoelectric single crystal ingot containing a relaxor having a composition formula of $Pb(B_1, B_2)O_3$ and lead titanate having a composition of $PbTiO_3$, using a Bridgman method, the production method including continuously feeding a raw material, which has a maximum particle size of 3 mm or less and contains the relaxor and the lead titanate, into a crucible for growth so that a concentration of the lead titanate is substantially constant in a growth direction of single crystal, and a variation range of the concentration is ±0.5 mol % or less over a length of 100 mm or more in the growth direction of single crystal.

(2) A piezoelectric single crystal ingot produced by the production method according to (1), in which a concentration of lead titanate is substantially constant, and a variation range of the concentration is ±0.5 mol % or less over a length of 100 mm or more in a growth direction of single crystal.

(3) The piezoelectric single crystal ingot according to (2), in which the piezoelectric single crystal ingot further contains 0.5 ppm by mass to 5% by mass in total of one or more selected from Cr, Mn, Fe, Li, Ca, Sr, Ba, Zr, and Sm when 1 mol of Pb is 100% by mass.

(4) A piezoelectric device produced from the piezoelectric single crystal ingot according to (2) or (3).

Advantageous Effects of Invention

According to the present invention, it is possible to easily produce a piezoelectric single crystal ingot in which the concentration of $PbTiO_3$ is substantially constant in the growth direction of single crystal, and the variation range of the concentration is remarkably small as compared with a conventional technique, and an industrially quite significant effect can be obtained. In addition, there is also an effect that a piezoelectric device having excellent piezoelectric properties can be produced at high yield from the piezoelectric single crystal ingot of the present invention.

DESCRIPTION OF EMBODIMENTS

A piezoelectric single crystal ingot of the present invention is a solid solution piezoelectric single crystal ingot which contains a relaxor having a composition formula of $Pb(B_1, B_2)O_3$ and lead titanate having a composition of $PbTiO_3$ and has a perovskite structure. Examples thereof include a solid solution piezoelectric single crystal ingot (PMN-PT) containing a relaxor having a composition formula of $Pb(Mg_{1/3}Nb_{2/3})O_3$ and lead titanate having a composition of $PbTiO_3$ and a solid solution piezoelectric single crystal ingot (PIN-PMN-PT) containing a relaxor having a composition formula of $Pb(In_{1/2}Nb_{1/2})O_3$ and $Pb(Mg_{1/3}Nb_{2/3})O_3$ and lead titanate having a composition of $PbTiO_3$.

The term "solid solution single crystal" as used herein refers to a single crystal in which two materials in the single crystal are completely dissolved in each other in a liquid state and completely make a solid solution together even in a solid state.

The piezoelectric single crystal ingot of the present invention is produced using a vertical Bridgman method.

Figure 1:
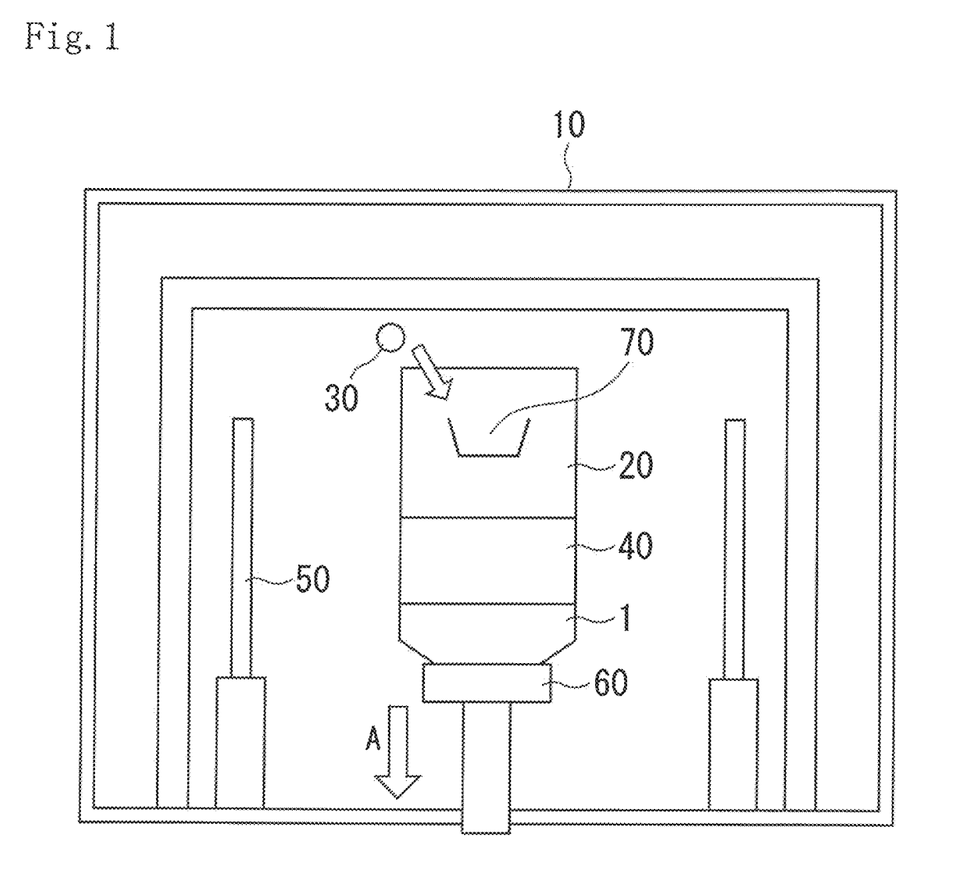
FIG. 1 is an explanatory view (cross-sectional view) schematically illustrating a single crystal growth (manufacturing) apparatus suitable for carrying out the present invention.

An outline of the vertical Bridgman method is illustrated in FIG. 1. In the vertical Bridgman method, a raw material in a crucible for growth 20 is heated to a melting point or higher by using a heat source (heater) 50 to form a melt layer 40. Then the crucible for growth 20 is moved in the low temperature direction (the A direction in FIG. 1), and unidirectional solidification is started from a lower portion of the crucible to produce a single crystal 1. The crucible for growth 20 is installed on a lift mechanism 60 and is movable up and down in a furnace.

When the piezoelectric single crystal 1 is produced using the vertical Bridgman method, first, an initial raw material is filled into the crucible for growth 20. Preferred examples of the initial raw material include a mixed powder obtained by blending and mixing a predetermined amount of a powder of a relaxor having a composition formula of $Pb(B_1, B_2)O_3$ and a lead titanate powder having a composition of $PbTiO_3$ so as to obtain a desired piezoelectric single crystal composition and a sintered polycrystalline body pellet of a relaxor-lead titanate solid solution. Furthermore, the initial raw material may be a pellet or the like obtained by sintering a mixture of a relaxor having a composition formula of $Pb(B_1, B_2)O_3$ and lead titanate having a composition of $PbTiO_3$ so as to obtain a desired piezoelectric single crystal composition.

The crucible for growth 20 filled with the initial raw material is heated by the heater 50, and the internal initial raw material is melted to form the melt layer 40. Next, the crucible for growth 20 is moved in the arrow A direction, which is the low temperature direction, by the lift mechanism 60, whereby unidirectional solidification is started from the lower portion of the crucible to form the piezoelectric single crystal 1.

The concentration of lead titanate in the single crystal 1 of the relaxor-lead titanate solid solution precipitated from the melt layer 40 varies according to a segregation coefficient $k_{eff}$ of lead titanate. $k_{eff}$ is a constant that defines a ratio of the concentration of lead titanate $PbTiO_3$ in the solid solution to the concentration of lead titanate $PbTiO_3$ in the melt layer 40. When $k_{eff}$ is different from 1, segregation proceeds in the single crystal 1 of the relaxor-lead titanate solid solution. For example, in the case of PMN-PT, the segregation coefficient $k_{eff}$ of lead titanate is less than 1, and as a solid solution single crystal grows, segregation of $PbTiO_3$ occurs, the concentration of $PbTiO_3$ in the melt layer 40 increases, and compositional variation in the melt layer 40 occurs. As a result, in the produced piezoelectric single crystal 1, segregation occurs where the concentration of $PbTiO_3$ increases in a crystal growth direction. Also in the case of PIN-PMN-PT, the segregation coefficient $k_{eff}$ of lead titanate is less than 1.

Thus, in the present invention, the compositional variation of the melt layer 40 in the crucible for growth 20 during single crystal growth is suppressed. For this purpose, a feedstock 30 is continuously dropped into a sub-crucible 70 in the crucible for growth 20 at a constant feed rate.

The dropped feedstock 30 is heated and melted in the sub-crucible 70 and then added dropwise and fed to the melt layer 40. In the present invention, the feedstock 30 is a raw material having a maximum particle size of 3 mm or less. As a result, variation in the time of melting the feedstock 30 is reduced, and the melted feedstock can be added dropwise to the melt layer 40 at a constant feed rate. When the size of the feedstock 30 increases beyond 3 mm, the melting time in the sub-crucible 70 varies greatly, the amount of the melted feedstock fed to the melt layer 40 varies, and the feed rate is not constant. Thus, the compositional variation of the melt layer 40 increases, and the compositional variation in the growth direction in the obtained piezoelectric single crystal 1 increases. The size of the feedstock is more preferably in the range of 1 to 3 mm in consideration of ease of handling. Furthermore, the feedstock 30 is preferably a raw material having a composition where a $PbTiO_3$ fraction is reduced as compared with the initial raw material.

After the solidification is completed up to an upper portion of the crucible for growth 20, cooling is performed to room temperature to obtain a piezoelectric single crystal ingot 1. The obtained piezoelectric single crystal ingot 1 is an ingot in which the concentration of $PbTiO_3$ is substantially constant and a variation range of the concentration is small. Specifically, it is possible to produce the piezoelectric single crystal ingot 1 which has a uniform composition and in which the $PbTiO_3$ concentration is substantially constant and the variation range of the concentration is ±0.5 mol % or less over a length of 100 mm or more in the growth direction of single crystal.

When a relative dielectric constant $\varepsilon_r$ or a mechanical quality factor $Q_m$, which are properties of a piezoelectric single crystal device, must be high, the piezoelectric single crystal ingot described above preferably further contains 0.5 ppm by mass to 5% by mass in total of one or more selected from Cr, Mn, Fe, Li, Ca, Sr, Ba, Zr, and Sm when 1 mol of Pb is 100% by mass. When the content is less than 0.5 ppm by mass, the effect is not remarkable. On the other hand, when the content exceeds 5% by mass, the possibility of generating a polycrystal becomes large. Thus, when these elements are contained, the total content is preferably limited to the range of 0.5 ppm by mass to 5% by mass. Among these elements, the addition of Cr, Mn, and Fe effectively contributes to improvement of the mechanical quality factor and suppression of deterioration over time. Further, the addition of Li effectively contributes to suppression of formation of a polycrystalline region. Furthermore, the addition of Ca, Sr, Ba, Zr, and Sm effectively contributes to improvement of the relative dielectric constant sr.

Hereinafter, the present invention will be further described with reference to Examples.

EXAMPLES

Example 1

A PMN-PT piezoelectric single crystal ingot was produced using the vertical Bridgman method. A single crystal growth (manufacturing) apparatus used is illustrated in FIG. 1.

As an initial raw material, 66% of PMN and 34% of PT were blended in terms of mass % relative to the total amount of the initial raw material, and 3,000 g of the mixed raw material was filled in the crucible for growth 20. The crucible for growth 20 was installed on the lift mechanism 60 in the furnace. Next, the crucible for growth 20 was heated with the heater 50 to 1,350° C. or higher, which is higher than the melting point, to melt the initial raw material 20 and thus to form the melt layer 40. Subsequently, the crucible for growth 20 was lowered in the A direction by the lift mechanism 60 to start solidification from a lower portion of the melt layer 40 in the crucible for growth 20.

Next, the feedstock 30 was continuously dropped into the sub-crucible 70 in the crucible for growth 20 at a constant feed rate. As the dropped feedstock 30, a material obtained by blending and mixing 71% of PMN and 29% of PT in terms of mass % relative to the total amount of the feedstock was used. The feedstock 30 used had a maximum particle size of 3 mm or less. The particle size was measured by a sieving method. The "sieving method" as used herein was performed in accordance with the provisions of JIS Z 8815-1994.

The dropped feedstock 30 was heated and melted in the sub-crucible 70 and then fed to the melt layer 40. The dropping was stopped once a certain amount of the feedstock 30 was dropped. When the length of the single crystal reached 220 mm, the descent of the crucible for growth 20 was stopped, and cooling was performed to room temperature. After cooling, the obtained piezoelectric single crystal ingot was taken out from the manufacturing apparatus and used as Invention Example 1.

A piezoelectric single crystal ingot was produced as Comparative Example 1 under the same conditions as Invention Example 1 except that the feedstock 30 having a maximum particle size of 3 to 4 mm was charged into the sub-crucible 70.

For the obtained piezoelectric single crystal ingot (diameter: about 80 mmϕ), a crystal orientation of the side face of the ingot was confirmed by an X-ray direction finder, and then the ingot was roughly cut by a cutting machine so that a wafer having a {001} orientation was obtained. Then, a precision cutting machine was used to cut out a piezoelectric device material of a desired size having a {100} orientation from the roughly cut wafer, and an X-ray fluorescence analyzer XRF was used to measure the concentration (mol %) of lead titanate PbTiO₃ at each length position along the growth direction of single crystal. The obtained results are illustrated in FIG. 2.

Figure 2:
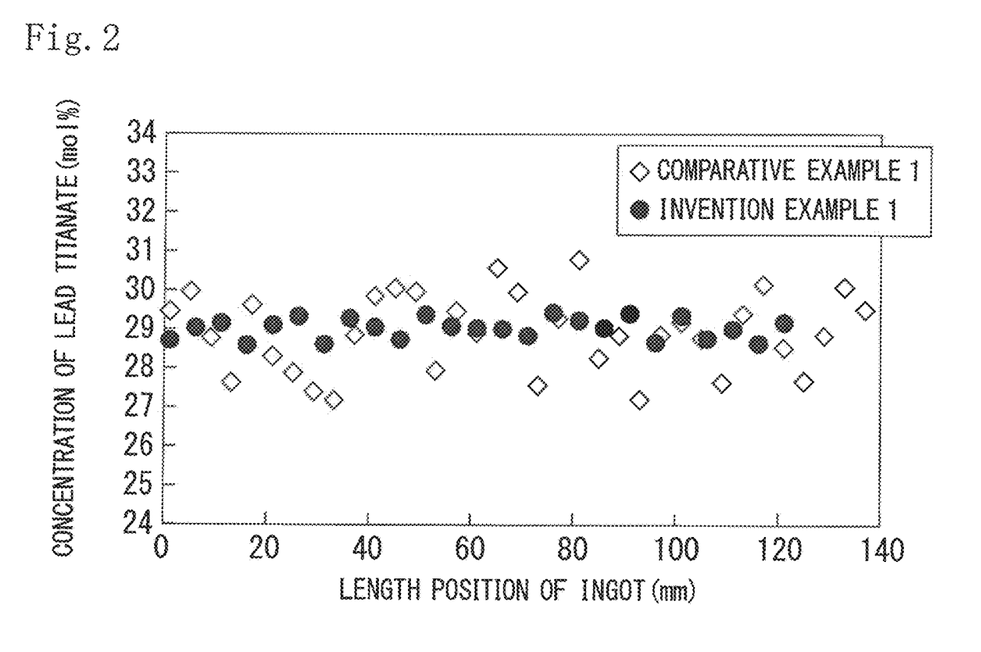
FIG. 2 is a graph illustrating an example of variation of concentration (mol %) of lead titanate along an ingot growth direction.

As seen from FIG. 2, in Invention Example 1, the concentration (mol %) of lead titanate $PbTiO_3$ is substantially constant at each position in the growth direction of single crystal, and the variation range of the concentration (composition ratio) of lead titanate $PbTiO_3$ is ±0.5 mol % or less over 100 mm or more in the growth direction of single crystal. On the other hand, Comparative Example 1 shows that the variation range of the concentration (composition ratio) of lead titanate $PbTiO_3$ greatly varies by more than ±0.5 mol % in the growth direction of single crystal.

A desired wafer was obtained by rough cutting from a piezoelectric single crystal ingot whose required crystallographic orientation was determined. Next, after the wafer was ground and polished to have a predetermined thickness, a piezoelectric single crystal device material was cut out from the wafer by a precision cutting machine. Electrodes were prepared on upper and lower surfaces of the obtained piezoelectric single crystal device material and subjected to polarization treatment to obtain a piezoelectric single crystal device. Next, each piezoelectric constant $d_{33}$ of these piezoelectric single crystal devices was measured using a $d_{33}$ meter. The obtained results are illustrated in FIG. 3.

Figure 3:
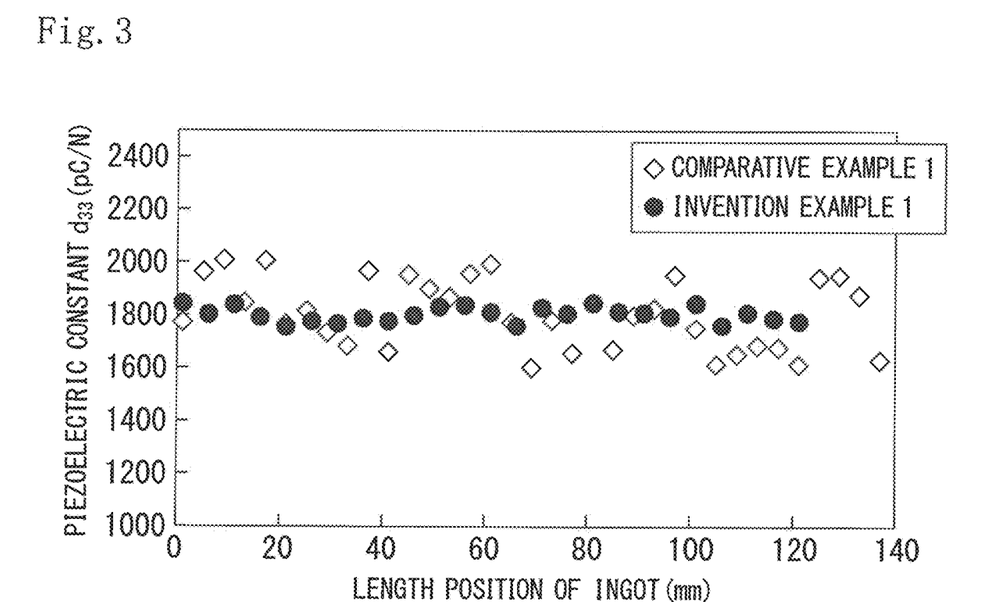
FIG. 3 is a graph illustrating an example of variation of piezoelectric constant along the ingot growth direction.

As seen from FIG. 3, in Invention Example 1, variation in the piezoelectric constant $d_{33}$ is little at each position along the growth direction of single crystal, and it can be said that a uniform piezoelectric single crystal ingot is obtained from which a piezoelectric device having an excellent piezoelectric constant can be produced at high yield. On the other hand, in Comparative Example 1, the piezoelectric constant $d_{33}$ varies greatly, and it cannot be said that a piezoelectric single crystal ingot is obtained from which a piezoelectric device having excellent piezoelectric properties can be produced at high yield.

Example 2

A PIN-PMN-PT piezoelectric single crystal ingot was produced as in Example 1 using the vertical Bridgman method and used as Invention Example 2. The single crystal growth (manufacturing) apparatus illustrated in FIG. 1 was used as in Example 1.

In Invention Example 2, as an initial raw material, 26% of PIN, 40% of PMN, and 34% of PT were blended in terms of mass % relative to the total amount of the initial raw material, and 3,000 g of the mixed raw material was used. As the feedstock 30, a material obtained by blending and mixing 26% of PIN, 45% of PMN, and 29% of PT in terms of mass % relative to the total amount of the feedstock was used. The feedstock 30 had a maximum particle size of 3 mm or less. The particle size was measured by a sieving method as in Example 1.

In Invention Example 2, the piezoelectric single crystal ingot was produced using the above raw materials by the same method as in Invention Example 1. A piezoelectric single crystal device material and a piezoelectric single crystal device were produced from the ingot and evaluated as in Example 1. A piezoelectric single crystal ingot was produced as Comparative Example 2 under the same conditions as Invention Example 2 except that as the feedstock 30, a raw material having the same composition as that of Invention Example 2 and having a maximum particle size of 3 to 4 mm was used. A piezoelectric single crystal device material and a piezoelectric single crystal device were produced from the ingot and evaluated as described above. The obtained results are illustrated in FIGS. 4 and 5.

Figure 4:
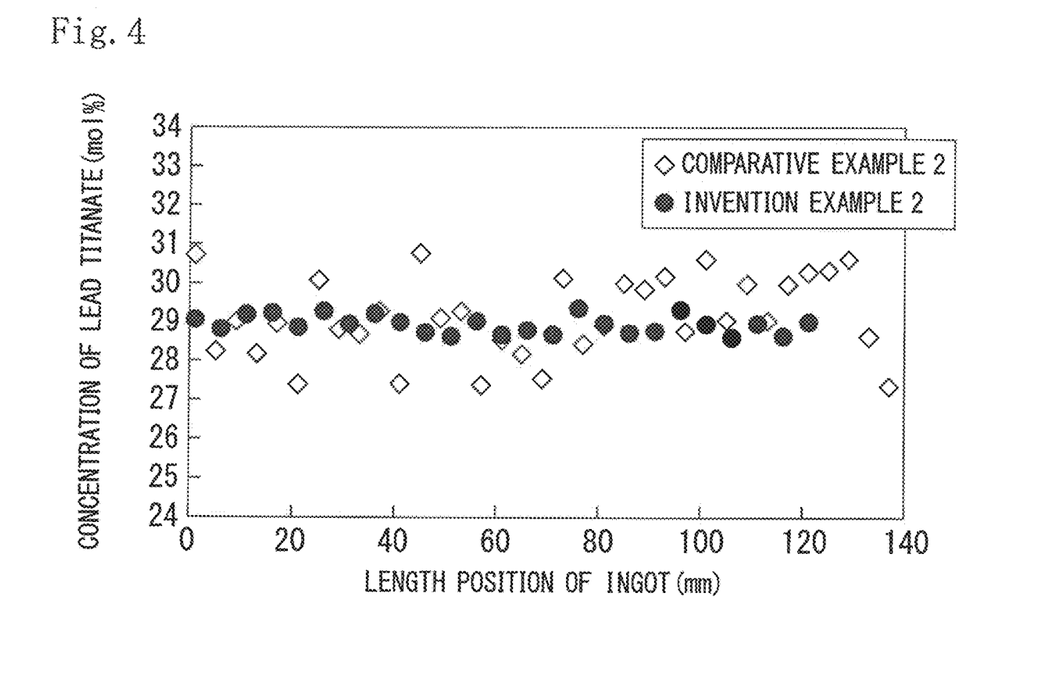
FIG. 4 is a graph illustrating an example of the variation of the concentration (mol %) of lead titanate along the ingot growth direction.

As seen from FIG. 4, in Invention Example 2, as in Invention Example 1, the concentration (mol %) of lead titanate $PbTiO_3$ is substantially constant at each position in the growth direction of single crystal, and the variation range of the concentration of lead titanate $PbTiO_3$ is ±0.5 mol % or less over 100 mm or more in the growth direction of single crystal. On the other hand, Comparative Example 2 shows that the variation range of the concentration of lead titanate $PbTiO_3$ greatly varies by more than ±0.5 mol % in the growth direction of single crystal.

Figure 5:
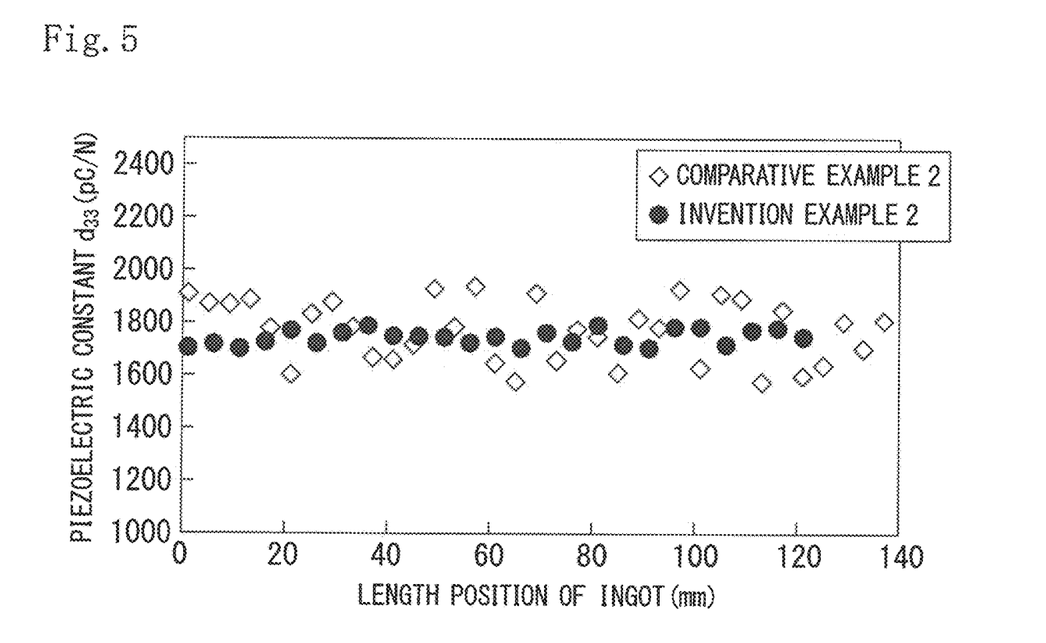
FIG. 5 is a graph illustrating an example of the variation of the piezoelectric constant along the ingot growth direction.

As seen from FIG. 5, in Invention Example 2, variation in the piezoelectric constant $d_{33}$ is little at each position along the growth direction of single crystal, and it can be said that a uniform piezoelectric single crystal ingot is obtained from which a piezoelectric device having an excellent piezoelectric constant can be produced at high yield. On the other hand, in Comparative Example 2, the piezoelectric constant $d_{33}$ varies greatly, and it cannot be said that a piezoelectric single crystal ingot is obtained from which a piezoelectric device having excellent piezoelectric properties can be produced at high yield.

Example 3

An Mn-added PMN-PT piezoelectric single crystal ingot was produced as in Example 1 using the vertical Bridgman method and used as Invention Example 3. The single crystal growth (manufacturing) apparatus illustrated in FIG. 1 was used as in Example 1.

In Invention Example 3, as an initial raw material, 9% of MnO, 57% of PMN, and 34% of PT were blended in terms of mass % relative to the total amount of the initial raw material, and 3,000 g of the mixed raw material was used. As the feedstock 30, a material obtained by blending and mixing 4% of MnO, 67% of PMN, and 29% of PT in terms of mass % relative to the total amount of the feedstock was used. The feedstock 30 had a maximum particle size of 3 mm or less. The particle size was measured by a sieving method as in Example 1.

In Invention Example 3, the piezoelectric single crystal ingot was produced using the above raw materials by the same method as in Invention Example 1. A piezoelectric single crystal device material and a piezoelectric single crystal device were produced from the ingot and evaluated as in Example 1. A piezoelectric single crystal ingot was produced as Comparative Example 3 under the same conditions as Invention Example 3 except that as the feedstock 30, a raw material having the same composition as that of Invention Example 3 and having a maximum particle size of 3 to 4 mm was used. A piezoelectric single crystal device material and a piezoelectric single crystal device were produced from the ingot and evaluated as described above. The obtained results are illustrated in FIGS. 6 and 7.

Figure 6:
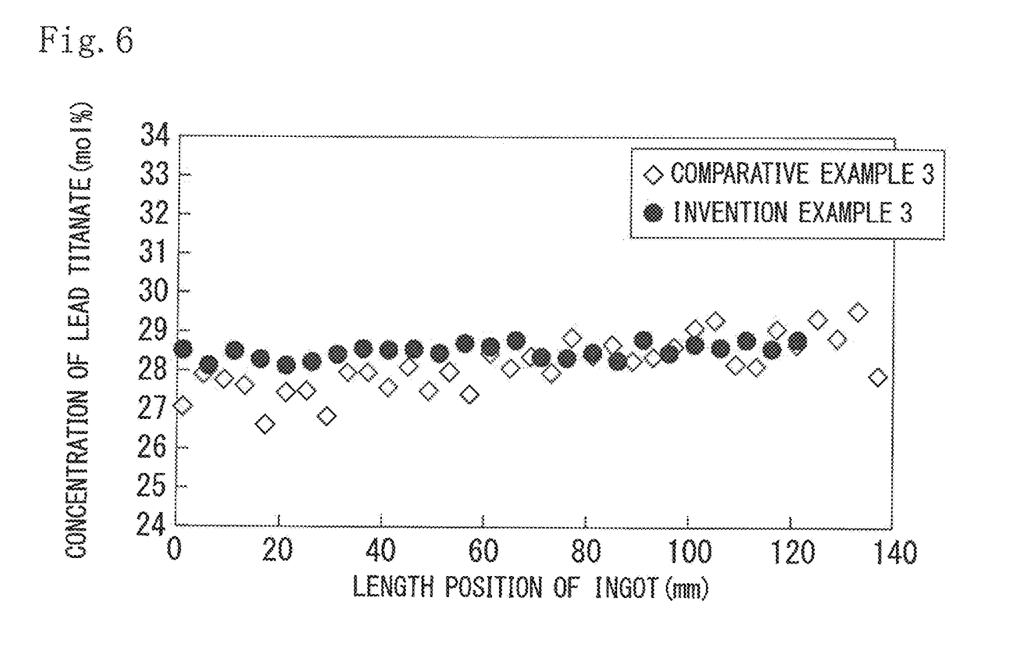
FIG. 6 is a graph illustrating an example of the variation of the concentration (mol %) of lead titanate along the ingot growth direction.

As seen from FIG. 6, in Invention Example 3, as in Invention Example 1, the concentration (mol %) of lead titanate $PbTiO_3$ is substantially constant at each position in the growth direction of single crystal, and the variation range of the concentration of lead titanate $PbTiO_3$ is ±0.5 mol % or less over 100 mm or more in the growth direction of single crystal. On the other hand, Comparative Example 3 shows that the variation range of the concentration of lead titanate $PbTiO_3$ greatly varies by more than ±0.5 mol % in the growth direction of single crystal.

Figure 7:
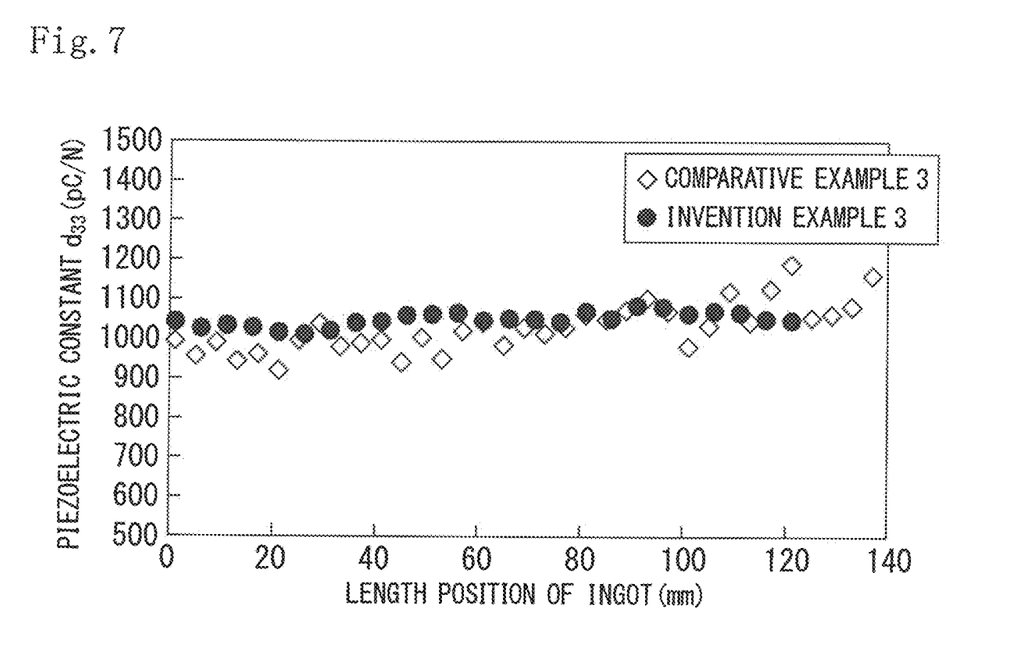
FIG. 7 is a graph illustrating an example of the variation of the piezoelectric constant along the ingot growth direction.

As seen from FIG. 7, in Invention Example 3, variation in the piezoelectric constant $d_{33}$ is little at each position along the growth direction of single crystal, and it can be said that a uniform piezoelectric single crystal ingot is obtained from which a piezoelectric device having an excellent piezoelectric constant can be produced at high yield. On the other hand, in Comparative Example 3, the piezoelectric constant $d_{33}$ varies greatly, and it cannot be said that a piezoelectric single crystal ingot is obtained from which a piezoelectric device having excellent piezoelectric properties can be produced at high yield.

REFERENCE SIGNS LIST

1 Piezoelectric single crystal ingot (piezoelectric single crystal, single crystal)
10 Single crystal growth (manufacturing) apparatus
20 Crucible for growth
30 Feedstock
40 Melt layer
50 Heater (heat source)
60 Lift mechanism
70 Sub-crucible

The invention claimed is:

1. A method for producing a solid solution piezoelectric single crystal ingot containing a relaxor having a composition formula of $Pb(B_1, B_2)O_3$ and lead titanate having a composition of $PbTiO_3$, using a Bridgman method, the production method comprising continuously feeding a raw material, which has a maximum particle size of 3 mm or less and contains the relaxor and the lead titanate, into a crucible for growth so that a concentration of the lead titanate is substantially constant in a growth direction of single crystal, and a variation range of the concentration is ±0.5 mol % or less over a length of 100 mm or more in the growth direction of single crystal, wherein $B_1$ is at least one element selected from the group consisting of Zn, Mg, Ni, Sc, In and Yb, and $B_2$ is at least one element selected from the group consisting of Nb and Ta.

2. A piezoelectric single crystal ingot produced by the production method according to claim 1, wherein a concentration of lead titanate is substantially constant, and a variation range of the concentration is ±0.5 mol % or less over a length of 100 mm or more in a growth direction of single crystal.

3. The piezoelectric single crystal ingot according to claim 2, wherein the piezoelectric single crystal ingot further contains 0.5 ppm by mass to 5% by mass in total of one or more selected from Cr, Mn, Fe, Li, Ca, Sr, Ba, Zr, and Sm when 1 mol of Pb is 100% by mass.

4. A piezoelectric device produced from the piezoelectric single crystal ingot according to claim 2.

5. A piezoelectric device produced from the piezoelectric single crystal ingot according to claim 3.

* * * * *